United States Patent [19]

DeRemer

[11] 4,363,075

[45] Dec. 7, 1982

[54] VENTILATED ELECTRONIC APPARATUS FOR HEATED APPLIANCES

[75] Inventor: Harold A. DeRemer, Allentown, Pa.

[73] Assignee: General Electric Company, New York, N.Y.

[21] Appl. No.: 220,441

[22] Filed: Dec. 29, 1980

[51] Int. Cl.³ .................................... H05K 7/20
[52] U.S. Cl. .................................... 361/383; 361/399; 361/412
[58] Field of Search .................... 361/382–384, 361/412, 415, 395, 399; 174/15 R, 16 R; 219/10.55 R; 165/80 B, 80 D, 128, DIG. 5

[56] References Cited

U.S. PATENT DOCUMENTS

| | | | |
|---|---|---|---|
| 3,831,063 | 8/1974 | Keough | 200/159 B |
| 3,967,874 | 7/1976 | Calabro | 361/384 |
| 4,126,269 | 11/1978 | Bruges | 361/384 |
| 4,293,891 | 10/1981 | Matsui | 174/16 R |

FOREIGN PATENT DOCUMENTS 54-14039  1/1979  Japan ................ 219/10.55 R

*Primary Examiner*—G. P. Tolin
*Attorney, Agent, or Firm*—George R. Powers; Leonard J. Platt; John F. Cullen

[57] ABSTRACT

Equipment having a source of substantial heat is provided with a ventilated housing and an electronic assembly which can be mounted between ventilating air inlet and outlet opening means in the housing. The electronic assembly includes a plurality of parallel spaced-apart plates of which at least one of each adjacent pair of plates has electronic circuitry mounted thereon, the size and configuration of the inlet and outlet opening means and the spacing between the adjacent pairs of plates being sufficient for the flow of adequate ventilating air for the cooling of electronic circuitry mounted on the plates. The electronic assembly may be assembled into an integral unit by means of unique support elements prior to being mounted in the ventilated housing.

12 Claims, 10 Drawing Figures

U.S. Patent Dec. 7, 1982 Sheet 1 of 3 4,363,075
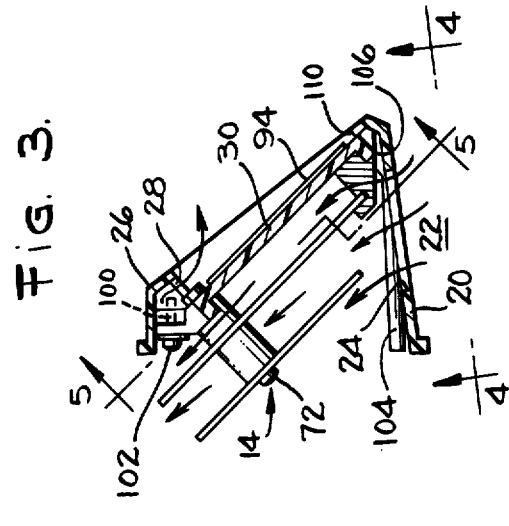
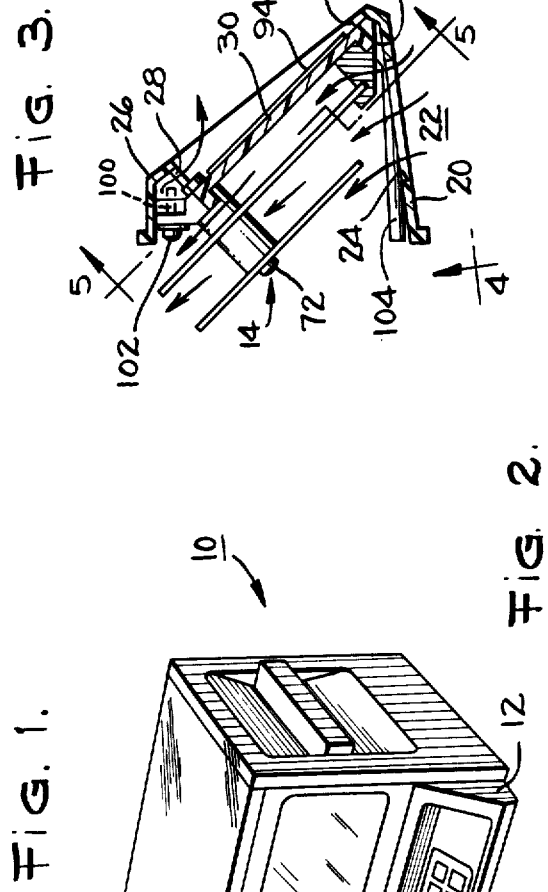
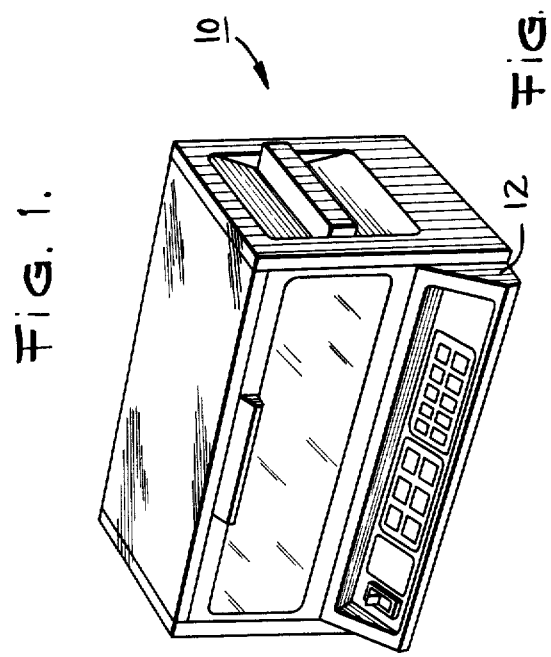
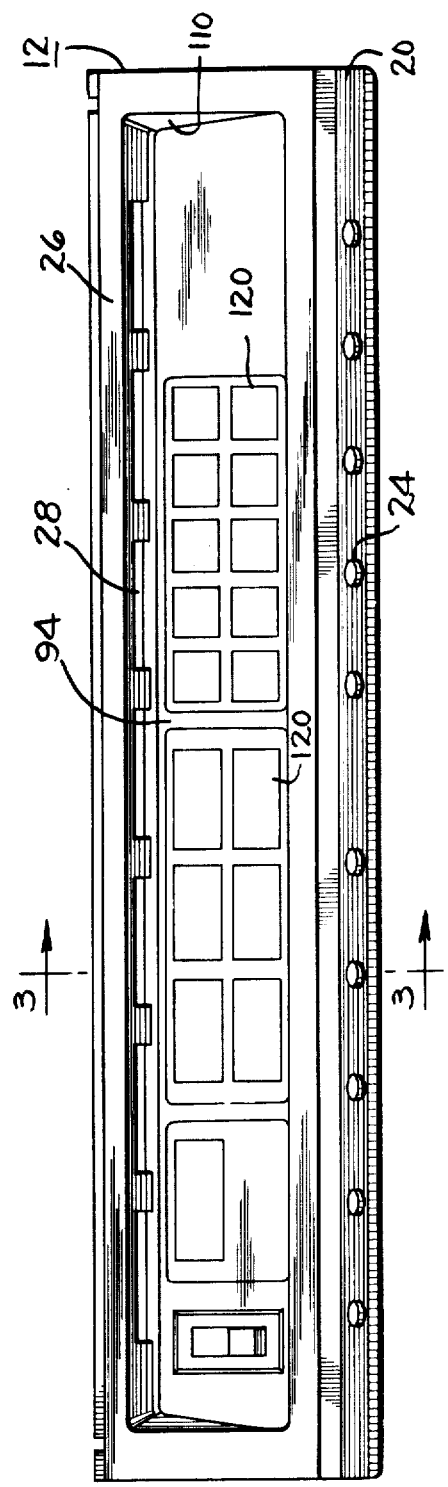

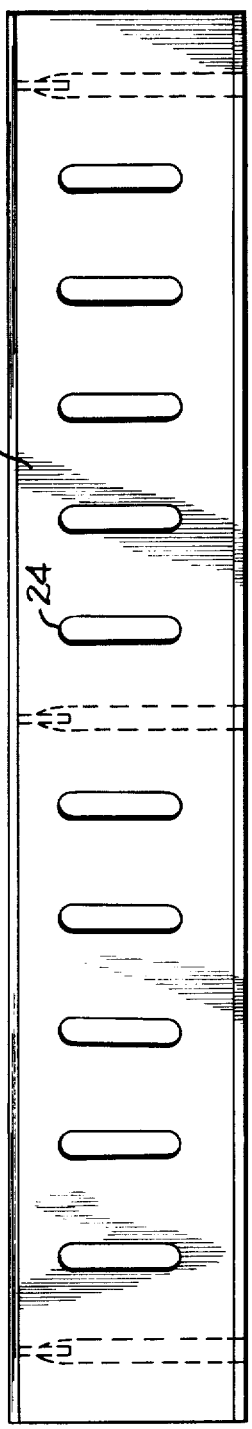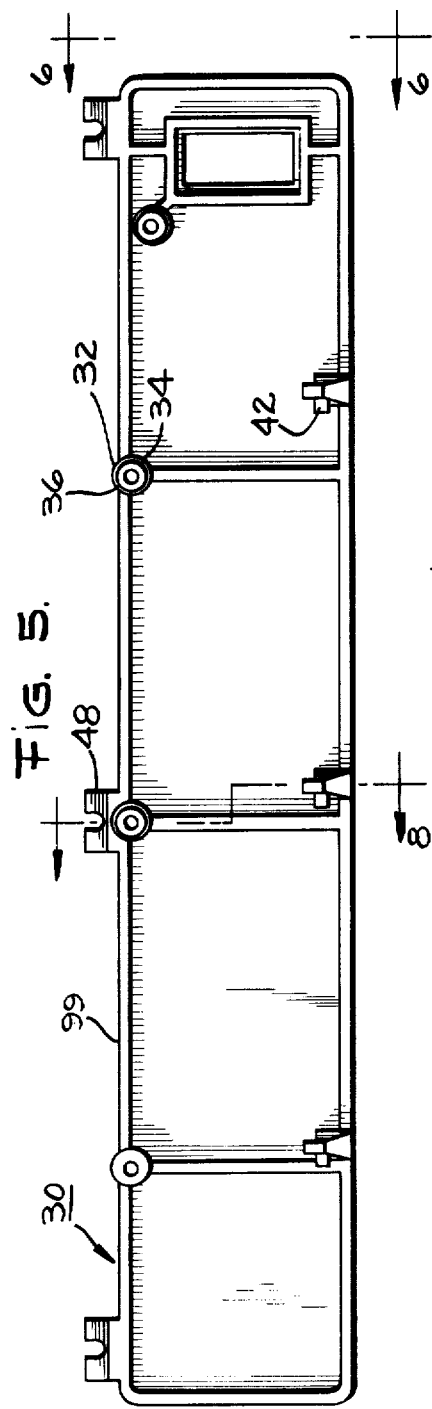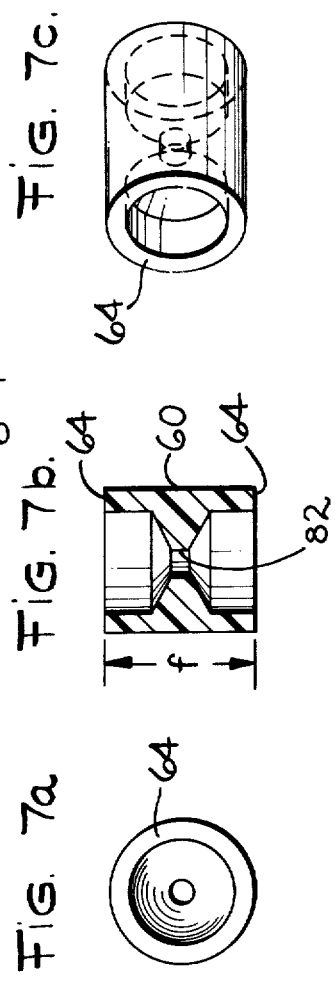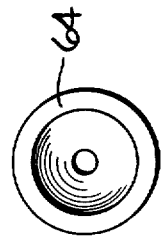

VENTILATED ELECTRONIC APPARATUS FOR HEATED APPLIANCES

BACKGROUND OF THE INVENTION

1. Field of the Invention

This invention relates to ventilated electronic apparatus suitable for use in high temperature environments such as household ovens and, more particularly, to an electronic control assembly which may be easily assembled and tested during manufacture, mounted in a manner such that adequate ventilation is provided to and through the electronic assembly, and readily accessed by the user of the appliance.

2. Description of the Prior Art

Small household appliances such as ovens have typically been provided with mechanical and electromechanical controls for controlling the operation of the appliance. With the advent of electronic controls, appliance designers have recognized the many potential advantages of electronic controls for such household appliances, the advantages including relatively low cost, the possibility of performing additional functions, greater accuracy, etc. In appliances such as ovens having sources of substantial heat, however, thermal stability characteristics of electronic devices have tended to discourage the use of electronic controls. More specifically, in order to provide reliable operation under the broad range of temperatures normally encountered in such appliances, it has been desirable heretofore to use relatively expensive electronic components having appropriate thermal characteristics and to provide extensive ventilating or insulating systems. It has heretofore been difficult to meet these requirements while still providing a control system that can be easily assembled and tested at reasonable cost and that can be easily accessed by the user of the appliance.

SUMMARY OF THE INVENTION

It is therefore an object of this invention to provide improved control apparatus for use in high temperature environments.

Another object is to provide improved electronic apparatus that is easy to assemble while still providing adequate ventilation for cooling the electronic components.

Yet another object of the invention is to provide an electronic control assembly that provides ventilating passages and may be mounted as a complete unit in a housing having ventilating openings therein.

A further object is to provide an electronic control assembly that may be easily accessed at all times by the user.

A still further object is to provide the foregoing objects in an electronic control assembly suitable for use in household appliances such as ovens.

Briefly stated, in carrying out the invention in one form, an electronic apparatus and a ventilating housing therefor are provided for applications in which high ambient temperatures are encountered during use. The housing includes a first wall portion having inlet opening means therein through which ventilating air may be admitted and a second wall portion having outlet opening means therein through which ventilating air may be discharged. The electronic assembly is mounted as a complete unit intermediate the inlet and outlet opening means, the electronic assembly comprising a plurality of spaced-apart plates of which at least one of each adjacent pair has electronic circuitry mounted thereon. The size and configuration of the inlet and outlet opening means and the spacing between adjacent plates are sufficient for the flow of adequate ventilating air for the cooling of electronic circuitry mounted on the plates. The electronic assembly includes a first plate, a second plate spaced from and substantially parallel to the first plate, and a third plate spaced from and substantially parallel to the second plate on the side of the second plate opposite the first plate. A plurality of first support elements are interposed between the first and second plates in abutment therewith to establish the spacing between the first and second plates, and a plurality of second support elements are interposed between the second and third plates in abutment therewith to establish the spacing between the second and third plates. Each of the second support elements is aligned with a respective one of the first support elements. A plurality of securing means are provided, each securing means associated with and extending through at least a portion of a respective pair of the first and second support elements to interconnect the first, second, and third plates into an integrated assembly.

By further aspects of the invention, the aligned ones of the first support elements comprise bosses formed integrally with and projecting from the first plate, and each boss has a shoulder portion thereon abutting the second plate to establish the spacing between the first and second plates. The second plate has an opening therein adjacent the shoulder portion, and the boss has a locating portion which projects through the opening to laterally locate the second plate relative to the first plate. The second support elements include shoulder portions abutting the facing sides of the second and third plates to establish the spacing therebetween. Each of the second support elements further includes means for engaging the locating portion of the respective boss to locate the second support element relative to the first and second plates. In accordance with still further aspects of the invention, the mounting means includes securing means for fastening a selected one of the plates to a selected one of the first and second wall portions, and the other wall portion has guide means for locating the electronic assembly in a fixed position relative thereto when the electronic assembly has been fastened to the selected wall portion. By yet another aspect of the invention, the selected plate forms a housing wall portion interconnecting the first and second wall portions when the selected plate is connected to the selected wall portion. As a result, electronic circuitry mounted on the selected plate may be readily accessed from outside of the ventilated housing.

BRIEF DESCRIPTION OF THE DRAWINGS

While the novel features of this invention are set forth with particularity in the appended claims, the invention, both as to organization and content, will be better understood and appreciated, along with other objects and features thereof, from the following description taken in connection with the drawings, in which:

FIG. 1 is a perspective view of a countertop oven incorporating the ventilated electronic apparatus of this invention;

FIG. 2 is a front view of the ventilated housing;

FIG. 3 is a cross-sectional view of the electronic apparatus and the ventilated housing therefore illustrated by FIGS. 1 and 2, the view being taken along viewing line 3—3 of FIG. 2;

FIG. 4 is a view of the lower portion of the ventilated housing taken along viewing line 4—4 of FIG. 3;

FIG. 5 is a view of the first plate of the electronic assembly, the view being taken along viewing line 5—5 of FIG. 3;

FIGS. 7a, b and c are views of one of the second support elements;

DESCRIPTION OF A PREFERRED EMBODIMENT

Figure 6:
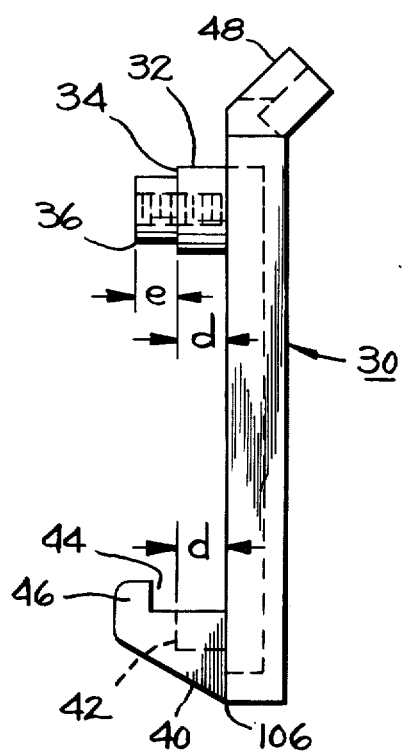
FIG. 6 is a view taken along viewing line 6—6 of FIG. 5.

The invention will be described with reference to a countertop oven 10 as illustrated by FIG. 1, but it will be appreciated by those skilled in the art as this description proceeds that the invention is equally applicable to other products characterized by sources of substantial heat. Electronic components are very sensitive to heat, and it is therefore important for reliability and cost reasons that the electronic circuitry not be forced to operate in an extremely high temperature environment. To avoid excessively high operating temperatures, the countertop oven 10 is provided with a ventilated housing portion 12 which contains electronic control apparatus for controlling the cooking functions of the oven 10. A front view of the housing 12 is illustrated by FIG. 2, and a cross-sectional view of the housing 12 and a removable electronic assembly 14 is shown by FIG. 3.

Referring now to FIGS. 2 through 4, the housing 12 includes a lower wall 20 inclined upwardly in the forward direction to provide a space 22 under the wall 20 to which ambient air can readily flow when the oven 10 is palced on a flat surface such as a countertop. The lower wall 20 has formed therein a plurality of inlet slots 24 through which air can enter the interior of the housing 12 from the space 22. An upper wall portion 26 has a plurality of outlet slots 28 provided therein for the discharge of ventilating air from the interior of the housing 12. The electronic assembly 14 is mounted on the lower and upper housing wall portions 20 and 26 in a manner hereinafter described, and the electronic assembly 14 is located between the inlet openings 24 and the outlet openings 28 such that ventilating air flowing between the inlet and outlet openings flows over and between the elements of the electronic assembly 14 as shown by FIG. 3 to cool electronic circuit elements mounted thereon. This cooling configuration will be described in greater detail below.

The electronic assembly 14 will now be described with particular reference to FIGS. 2, 3 and 5 through 8. As illustrated, the electronic assembly 14 includes a first plate 30 which serves as a support member for the remainder of the assembly 14. More particularly, the first plate 30 has, as best shown by FIGS. 5 and 6, a plurality of cylindrical bosses 32 which project therefrom a distance "d" to an annular shoulder portion 34. Inwardly of the shoulder portion 34, a smaller diameter cylindrical portion 36 projects away from the plate 30 a further distance "e". Spaced apart from the bosses 32 are a plurality of support elements 40 having support surfaces 42 thereon also located from the plate 30 a distance substantially equal to "d". A space 44 is formed between each surface 42 and an overhanging lip portion 46. The plate 30 is also provided with a plurality of mounting tabs 48 for facilitating mounting of the electronic assembly 14 within the housing 12.

Figure 8:
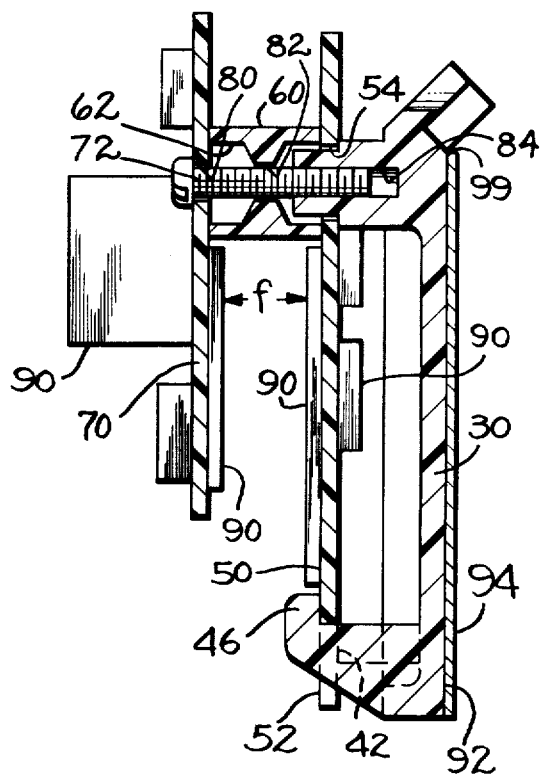
FIG. 8 is a cross-sectional view of the electronic assembly illustrating the parallel spaced-apart configurations of the plates and the alignment between the first and second support elements, the view being taken through the first plate along viewing line 8—8 of FIG. 5.

Referring now to FIGS. 6 and 8, a second plate 50 having a thickness approximately equal to that of the space 44 is mounted on the first plate 30 in spaced-apart relationship therewith. A lower edge portion 52 of the second plate 50 is slipped into the space 44, between the lips 46 and the support surfaces 42, and openings 54 are provided along the upper edge of the plate 50 to fit over the respective ones of the smaller diameter cylindrical portions 36 of the bosses 32. The openings 54 are large enough to fit over the portions 36, but are smaller in diameter than the shoulder portions 34 of the bosses 32. As a result, the second plate 50 is spaced from the first plate 30 by a distance "d" since the interplate spacing is determined by the spacing of the support surfaces 34 and 42 from the first plate 30. The length "e" of the smaller cylindrical portion 36 of the boss 32 is somewhat greater than the thickness of the plate 50 and, since the cylindrical portion 36 therefore extends entirely through the plate 50, the lateral positions of the plates 30 and 50 are fixed by the fit between the openings 54 in the plate 50 and the respective cylindrical portions 36 of the bosses 32.

After the second plate 50 is placed in position on the surfaces 34 and 42, a plurality of second support elements 60 (best shown by FIGS. 7a, b and c and FIG. 8) are each placed over the projecting ends of the respective cylindrical portions 36 of the first support elements or bosses 32. More particularly, the second support elements 60 include cylindrical cavities 62 therein having a diameter slightly greater than the diameter of the cylindrical portions 36 of the bosses 32 and a depth slightly greater than the distance by which the cylindrical portions 36 project beyond the second plate 50. When the support elements 60 are placed over the projecting ends of the respective cylindrical portions 36, the support elements 60 are located laterally with respect to both of the first and second plates. The second support elements 60 are provided with annular shoulder surfaces 64 spaced-apart a distance "f", one of the surfaces 64 contacting the face of the plate 50 facing away from the first plate 30 and the other surface 64 adapted to abut a third plate 70 as best shown by FIG. 8. The length "f" of the second support elements 60 thus establishes the spacing between the second and third plates of the electronic assembly.

In addition to establishing the spacing between the plates 30, 50 and 70, the bosses 32, the elements 40, and the spacers 60 also provide supporting structure whereby the second and third plates 50 and 70, respectively, may be supported from the first plate 30. To lock the plates into an integrated assembly, a screw 72 or other appropriate securing means is provided for each aligned pair of bosses 32 and spacers 60, the head of the screw 72 engaging the surface of the plate 70 facing away from the other two plates and extending therefrom through and into aligned openings 80, 82 and 84 in the third plate 70, the spacer 60 and the boss 36, respectively. The opening 84 is threaded for the screw 72 such that the plates may be drawn into firm engagement with their respective spacers.

Of each adjacent pair of plates, at least one has electronic circuit components mounted thereon as indicated generally at 90 in FIG. 8. The electronic circuitry 90 is thus exposed to the spaces between the plates and may therefore be cooled by ventilating air flowing therethrough between the inlet and outlet openings 24 and 28, respectively, as best shown by FIG. 3. The spacing between the plates and the spacing and configuration of the inlet and outlet openings 24 and 28 are selected such that adequate ventilating air will flow between the plates to cool the electronic circuitry. The precise configuration and spacing will, of course, be determined by many factors, including the nature of the circuit components, the ambient temperature within the housing, etc.

The first or base plate 30 may merely serve as a support member and thus not carry any of the electronic circuitry. Alternatively, it may carry circuitry along with the other plates. As illustrated by FIGS. 2, 3 and 8, the plate 30 of the illustrated embodiment has mounted on its outer surface 92, the surface facing away from the other plates, a membrane keyboard 94 which the user of the oven may use for programming the functions of the oven.

Referring now to FIGS. 2, 3, 4, 5, and 8, the integrated electronic assembly 14, which is assembled external to both the remainder of the oven 10 and its housing 12, may be inserted into and secured to the housing 12 in a simplified manner. The first plate 30 has at the upper edge 99 thereof a plurality of mounting tabs 48, and the upper housing portion 26 is provided with aligned and mating threaded openings 100 therein. The lower housing portion 20 is provided with a plurality of ribs 104 for contacting and guiding the lower edge 106 of the first plate 30 in a manner hereinafter described. Intermediate the first or lower housing portion 20 and the second or upper housing portion 26, the housing 12 has an opening therein 110 through which the electronic assembly 14 may be accessed when mounted in the housing 12.

To mount the electronic assembly 14 in the housing 12, the lower edge 106 of the first plate 30 is placed on the ribs 104, and the entire assembly 14 is pushed to the right as viewed in FIG. 3 until the tabs 48 approach the openings 100 in the upper housing portion 26. Screws 102 are then inserted through the mounting tabs 48 and are screwed into the threaded openings 100 to force the upper edge 99 of the plate against the upper housing 26. As this occurs, the lower edge 106 of the plate 30 slides along the ribs 104 into abutment with the lower housing 20, the angle of the ribs 104 being such that the lower edge 106 of the plate cannot swing back from contact with the lower housing 20 unless the screws 102 are removed so as to permit removal of the entire assembly 14. When the plate 30 is locked in position, the outer surface 92 and, more particularly, the membrane keyboard 94 closes off the opening 110 in the housing 12. In this manner, the plate 30 actually forms a portion of the housing 12 interconnecting the first and second housing portions 20 and 26. The various keys 120 on the keyboard 94 may be accessed through the opening 110 so that the control apparatus 14 within the housing 12 may be operated from outside of the housing.

The electronic control arrangement of this invention has a number of distinct advantages. First of all, it provides easy assembly for mass production. The plates 30, 50 and 70 supporting the electronic circuitry may be assembled externally of the oven 10 starting with the support panel 30, the other components being added in an easy and progressive fashion until the entire assembly is built up externally to the oven. The spacing and support arrangement provides a substantially rigid assembly. Heavier components such as relays may be placed near the support screws 72 for maximum support. The assembled control may then be subjected to various functional tests prior to being placed in the housing 12. In fact, the control assembly 14 may be assembled in the housing 12 and again subjected to tests before the housing 12 is connected to the remainder of the oven 10. In this manner, initial assembly is not only easy, but most problems can be easily corrected before final assembly. Through proper sizing and location of the inlet and outlet openings 24 and 28 in the housing 12 and the spacing between the plates, taken together with the inclined configuration of the lower wall 20 of the housing 12, adequate ventilation for cooling the control elements is assured during oven use. Finally, the location of the membrane keyboard 94 on the base plate 30 permits the control apparatus to be easily accessed by the user for programming the control functions.

From the foregoing, it will be seen that the apparatus of this invention is uniquely suited for use in applications where there is a relatively high ambient temperature, such as household ovens. The electronic apparatus and its housing provide rapid and easy assembly and adequate ventilation for cooling the electronic components during appliance use.

While the invention has been particularly shown and described with reference to a preferred embodiment thereof, it will be understood by those skilled in the art that various changes in form, details, and application may be made therein without department from the spirit and scope of the invention. In particular, the invention may be widely used where high temperatures are encountered; its use is not rectricted in any manner to household appliances such as ovens of the type illustrated. Accordingly, it is intended that all such modifications and changes be included within the scope of the appended claims.

What is claimed as new and is desired to secure by Letters Patent of the United States is:

1. In an apparatus having a source of substantial heat, electronic apparatus and a ventilated housing therefor comprising:

a first housing wall portion having inlet opening means therein through which ventilating air may be admitted, a second housing wall portion having outlet opening means therein through which ventilating air may be discharged, an electronic assembly comprising a plurality of parallel spaced-apart plates of which at least one of each adjacent pair of plates has electronic circuitry mounted thereon, said electronic assembly comprising:

a first plate, a second plate spaced from and substantially parallel to said first plate, a third plate spaced from and substantially parallel to said second plate on the side of said second plate opposite said first plate, a plurality of first support elements interposed between said first and second plates in abutment therewith to establish the spacing between said first and second plates, a plurality of second support elements interposed between said second and third plates in abutment therewith to establish the spacing between said second and third plates, each of said second support elements being aligned with a respective one of said first support elements, and a plurality of securing means each associated with and extending through at least a portion of a respective pair of said first and second support elements to interconnect said first, second and third plates into an integrated assembly, and mounting means for mounting said electronic assembly intermediate said inlet opening means and said outlet opening means such that electronic circuitry mounted on said plates may be cooled by air flowing between said parallel plates from said inlet opening means to said outlet opening means, the size and configuration of said inlet and outlet opening means and the spacing between adjacent plates being sufficient for the flow of adequate ventilating air for the cooling of electronic circuitry mounted on said plates.

2. Electronic apparatus and a ventilated housing therefor as defined by claim 1 in which said first support elements are integrally fixed to said first plate and said securing means extend through second and third plates and said second support means into engagement with the respective ones of said first support elements.

3. Electronic apparatus and a ventilated housing therefor as defined by claim 2 in which at least the aligned ones of said first support elements comprise bosses projecting from said first plate, each of said bosses having a shoulder portion thereon abutting the side of said second plate facing said first plate to establish the spacing between said first and second plates, said second plate having an opening therein adjacent each said shoulder portion and the respective boss further having a locating portion projecting through said opening so as to laterally locate said second plate relative to said first plate.

4. Electronic apparatus and a ventilated housing therefor as defined by claim 3 in which said second support elements include shoulder portions abutting the facing sides of said second and third plates to establish the spacing therebetween, each of said support elements including means engaging said locating portion of the respective one of said bosses such that said second support element is laterally located relative to said first and second plates.

5. In an apparatus having a source of substantial heat, electronic apparatus and a ventilated housing therefor comprising:

a first housing wall portion having inlet opening means therein through which ventilating air may be admitted, a second housing wall portion having outlet opening means therein through which ventilating air may be discharged, an electronic assembly comprising a plurality of parallel spaced-apart plates of which at least one of each adjacent pair of plates has electronic circuitry mounted thereon and securing means interconnecting said plurality of plates into an integrated assembly, and mounting means for mounting said electronic assembly intermediate said inlet opening means and said outlet opening means such that electronic circuitry mounted on said plates may be cooled by air flowing between said parallel plates from said inlet opening means to said outlet opening means, said mounting means comprising securing means for fastening a first one only of said plates to a selected one of said first and second housing wall portions, the other of said wall portions having guide means cooperating with said first plate only for locating said electronic assembly in a fixed position relative thereto, the size and configuration of said inlet and outlet opening means and the spacing between adjacent plates being sufficient for the flow of adequate ventilating air for the cooling of electronic circuitry mounted on said plates.

6. Electronic apparatus and a ventilated housing therefor as defined by claim 5 in which said first plate is fastened to said second housing wall portion by said securing means and in which said guide means engage said first plate to guide said first plate into a fixed position relative to said first housing wall portion.

7. Electronic apparatus and a ventilated housing therefor as defined by claim 6 in which said first plate forms a housing wall portion interconnecting said first and second housing wall portions whereby electronic circuitry mounted on said first plate may be accessed from outside of the ventilated housing.

8. In an apparatus having a source of substantial heat, electronic apparatus and a ventilated housing therefor comprising:

a first housing wall portion having inlet opening means therein through which ventilating air may be admitted, a second housing wall portion having outlet opening means therein through which ventilating air may be discharged, an electronic assembly comprising a plurality of parallel spaced-apart plates of which at least one of each adjacent pair of plates has electronic circuitry mounted thereon, said electronic assembly comprising:

a first plate, a second plate spaced from and substantially parallel to said first plate, a third plate spaced from and substantially parallel to said second plate on the side of said second plate opposite said first plate, a plurality of first support elements interposed between said first and second plates in abutment therewith to establish the spacing between said first and second plates, a plurality of second support elements interposed between said second and third plates in abutment therewith to establish the spacing between said second and third plates, each of said second support elements being aligned with a respective one of said first support elements, and a plurality of securing means each associated with and extending through at least a portion of a respective pair of said first and second support elements to interconnect said first, second and third plates into an integrated assembly, and mounting means for mounting said electronic assembly intermediate said inlet opening means and said outlet opening means such that electronic circuitry mounted on said plates may be cooled by air flowing between said parallel plates from said inlet opening means to said outlet opening means, said mounting means comprising securing means for fastening a first one of said plates to a selected one of said first and second housing wall portions, the other of said wall portions having guide means for locating said electronic assembly in a fixed position relative thereto when said electronic assembly is fastened to said selected wall portion by said securing means, the size and configuration of said inlet and outlet opening means and the spacing between adjacent plates being sufficient for the flow of adequate ventilating air for the cooling of electronic circuitry mounted on said plates.

9. Electronic apparatus and a ventilated housing therefor as defined by claim 8 in which at least the aligned ones of said first support elements comprise bosses projecting from said first plate, each of said bosses having a shoulder portion thereon abutting the side of said second plate facing said first plate to establish the spacing between said first and second plates, said second plate having an opening therein adjacent each said shoulder portion and the respective boss further having a locating portion projecting through said opening so as to laterally locate said second plate relative to said first plate.

10. Electronic apparatus and ventilating housing therefor as defined by claim 9 in which said second support elements include shoulder portions abutting the facing sides of said second and third plates to establish the spacing therebetween, each of said second support elements including means engaging said locating portions of the respective ones of said bosses such that said second support element is laterally located relative to said first and second plates.

11. Electronic apparatus and a venilated housing therefore as defined by claim 10 in which said first plate is fastened to said second housing wall portion by said securing means and in which said guide means engage said first plate to guide said first plate into a fixed position relative to said first housing wall portion.

12. Electronic apparatus and a ventilated housing therefore as defined by claim 11 in which said first plate forms a housing wall portion interconnecting said first and second housing wall portions, whereby electronic circuitry mounted on said first plate may be accessed from outside of the ventilated housing.

* * * * *